United States Patent
Regan et al.

(10) Patent No.: US 6,686,642 B2
(45) Date of Patent: Feb. 3, 2004

(54) MULTI-LEVEL INTEGRATED CIRCUIT FOR WIDE-GAP SUBSTRATE BONDING

(75) Inventors: Michael J. Regan, Corvallis, OR (US); John Liebeskind, Corvallis, OR (US); Charles C. Haluzak, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/879,876

(22) Filed: Jun. 11, 2001

(65) Prior Publication Data

US 2002/0185737 A1 Dec. 12, 2002

(51) Int. Cl.[7] .................. H01L 29/00; H01L 21/30; H01L 21/46; H01L 21/44; H01L 21/48; H01L 21/50
(52) U.S. Cl. .................. 257/521; 438/456; 438/107
(58) Field of Search .............. 257/623, 684, 257/521; 438/456, 719, 173.9, 107; 228/217, 221, 123.1

(56) References Cited

U.S. PATENT DOCUMENTS

| | | | | |
|---|---|---|---|---|
| 4,989,063 A | * | 1/1991 | Kolesar, Jr. .................. 357/54 |
| 5,216,490 A | * | 6/1993 | Greiff et al. .................. 73/517 |
| 5,557,596 A | | 9/1996 | Gibson et al. .............. 369/101 |
| 5,581,028 A | * | 12/1996 | Barth et al. ................. 73/204.6 |
| 5,903,099 A | * | 5/1999 | Johnson et al. ............. 313/495 |
| 5,919,548 A | * | 7/1999 | Barron et al. ................ 428/138 |
| 6,008,576 A | | 12/1999 | Nakatani et al. ............ 313/495 |
| 6,062,461 A | * | 5/2000 | Sparks et al. |
| 6,118,181 A | | 9/2000 | Merchant et al. ........... 257/757 |
| 6,137,212 A | | 10/2000 | Liu et al. ..................... 313/308 |
| 6,291,908 B1 | * | 9/2001 | Tran et al. ................... 307/112 |
| 6,319,745 B1 | * | 11/2001 | Bertin et al. .................. 438/60 |

FOREIGN PATENT DOCUMENTS

| | | |
|---|---|---|
| WO | WO99/28971 | 6/1991 |
| WO | WO01/24259 | 4/2001 |

OTHER PUBLICATIONS

Li, Xinxin, et al. "A Novel Fabrication Methodology For Micromachined Sensor–Arrays With Multi–Thickness Configuration." Microelectromechanical Systems (MEMS), vol. 1, 1999, p. 269–274.

Kutchoukov, V.G., et al. "New Photoresist coating method for 3–D structured wafers." Elsevier Sensors and Actuators, 85 (2000) pp. 377–383.

Carley, L. Richard, et al. "MEMS–Based Integrated–Circuit Mass–Storage Systems." Communications of the ACM, Nov. 2000, vol. 41, No. 11, pp. 73–80.

* cited by examiner

*Primary Examiner*—Eddie Lee
*Assistant Examiner*—Samuel A Gebremariam
(74) *Attorney, Agent, or Firm*—Timothy F. Myers

(57) ABSTRACT

An integrated circuit includes a substrate having an etched surface and a non-etched surface. The etched surface contains circuit elements and the non-etched surface contains a bonding surface. The non-etched surface is located at a predetermined height from the etched surface. Bonding this integrated circuit with another substrate creates a wide-gap between the substrates that is preferably evacuated and hermetically sealed.

17 Claims, 8 Drawing Sheets

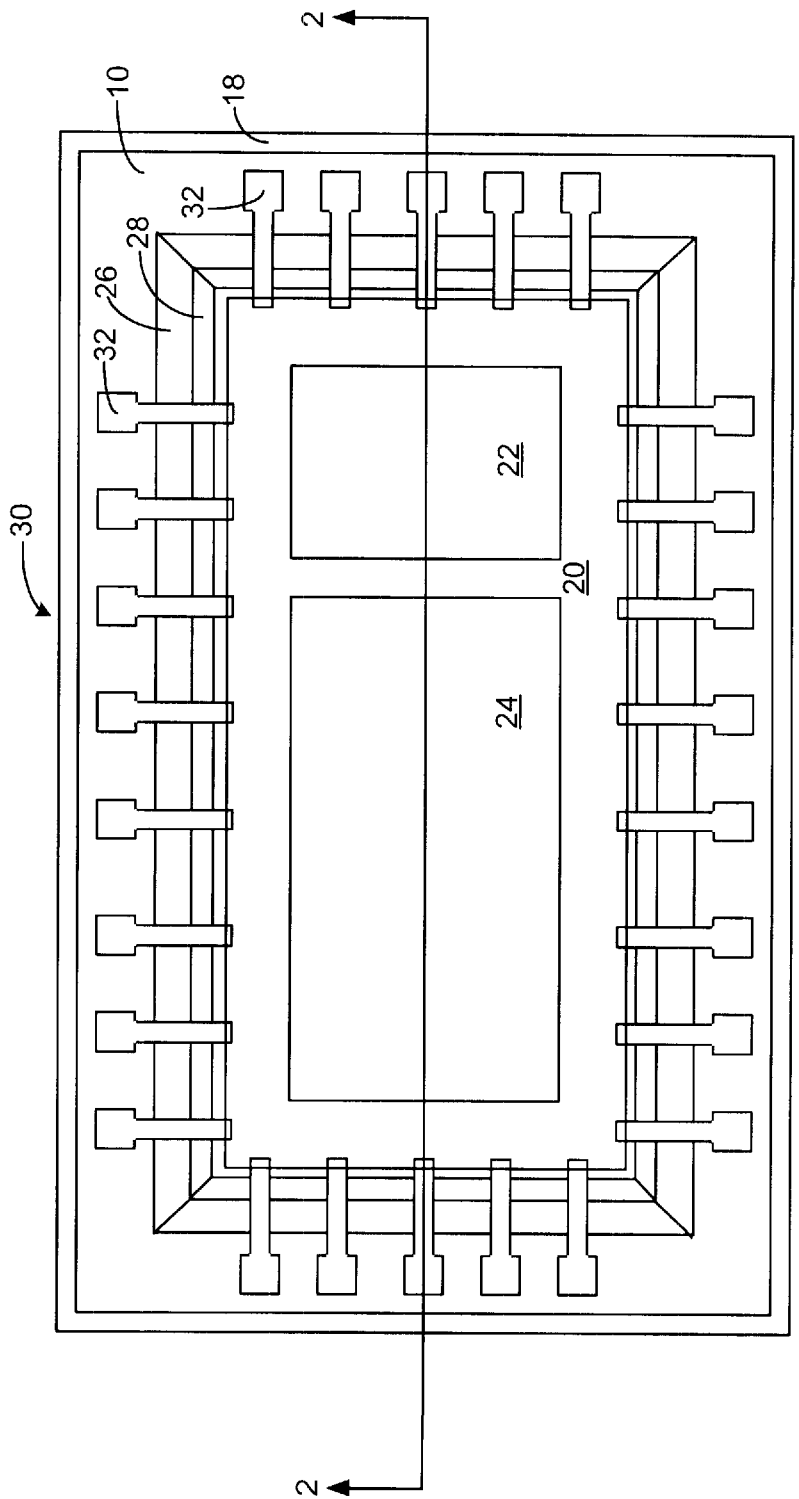
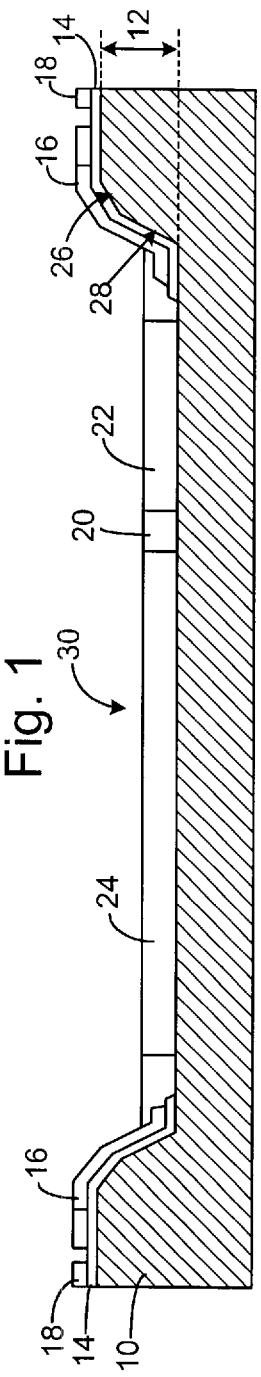
Fig. 1
Fig. 2

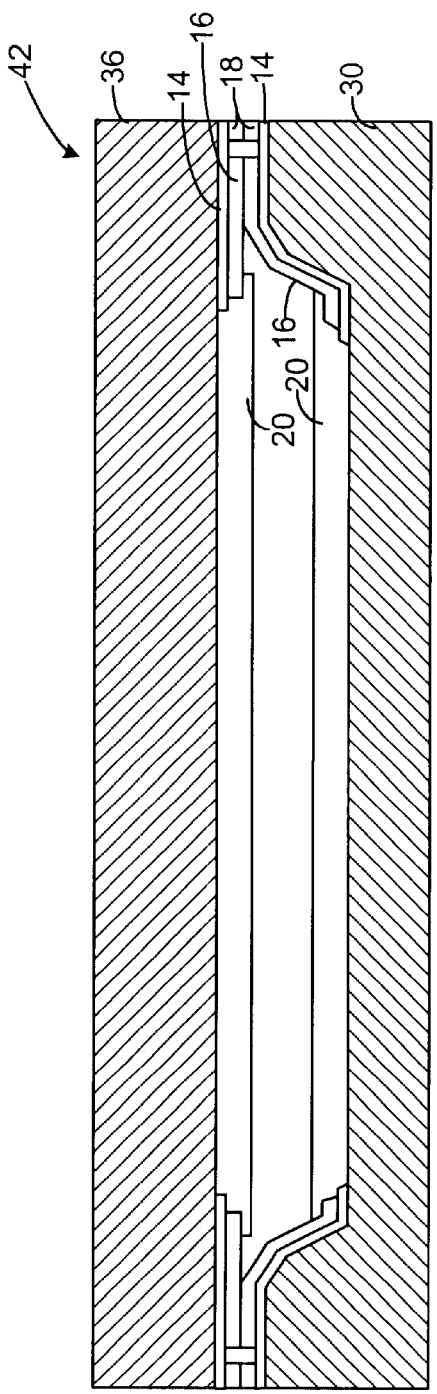
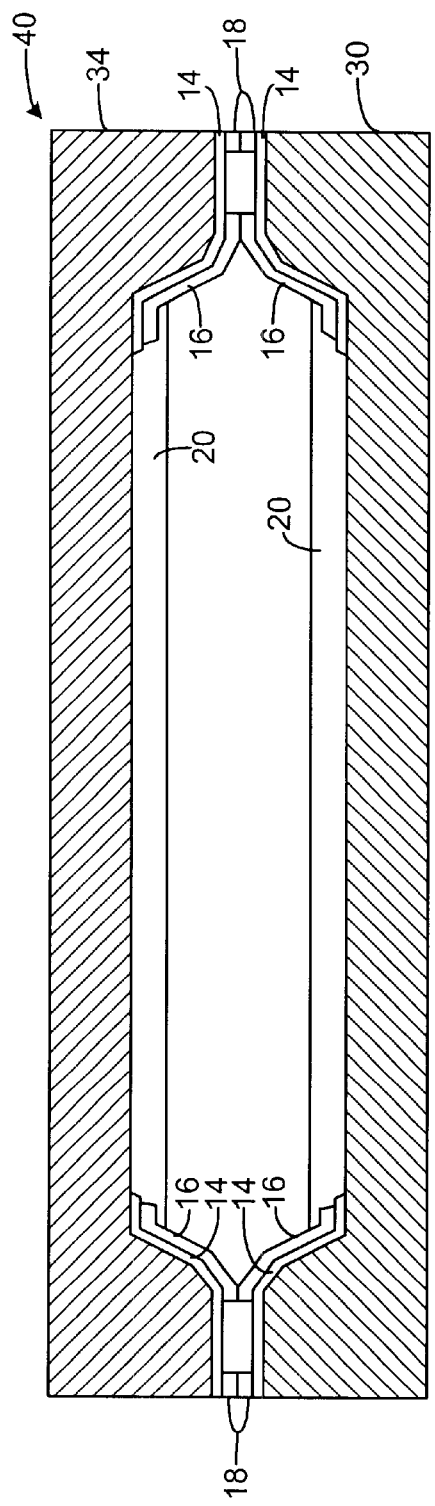

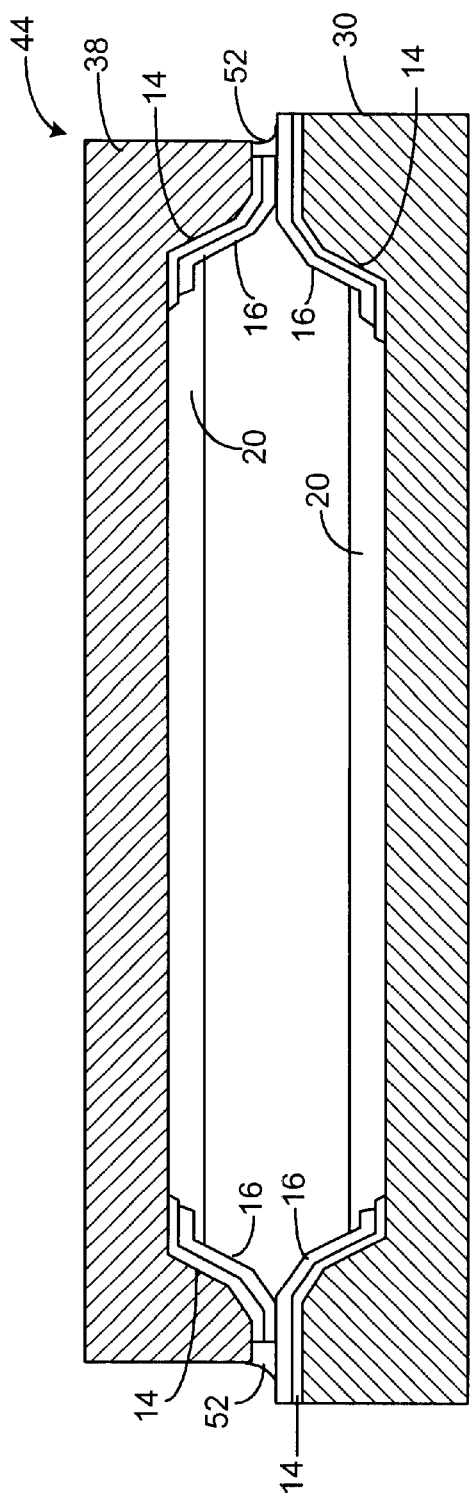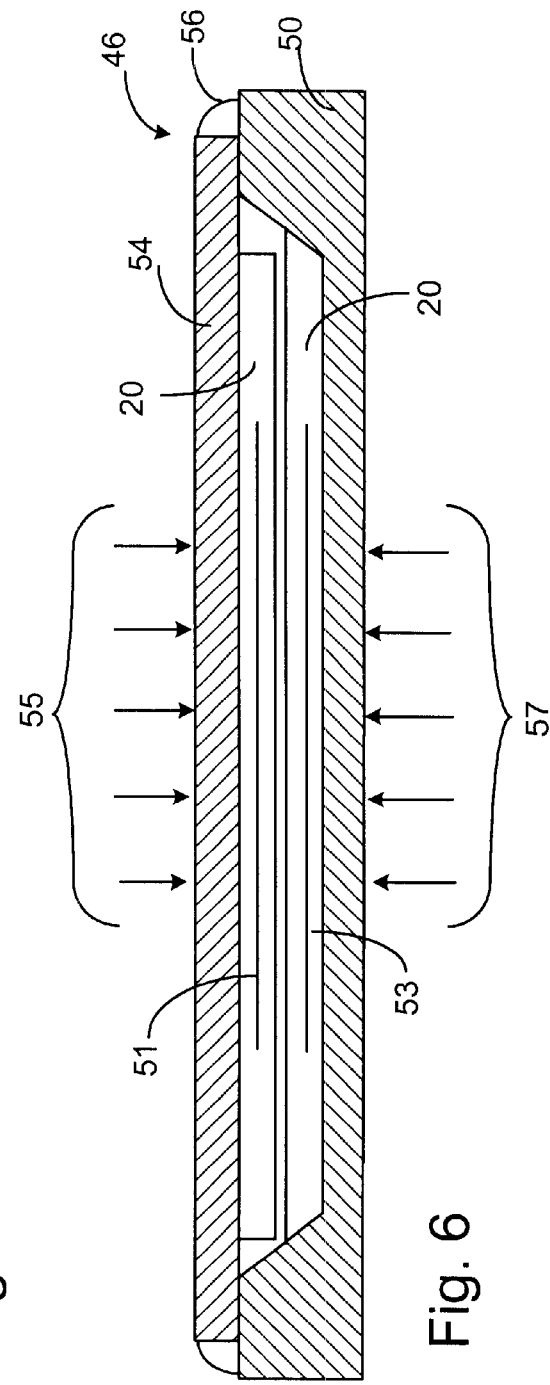

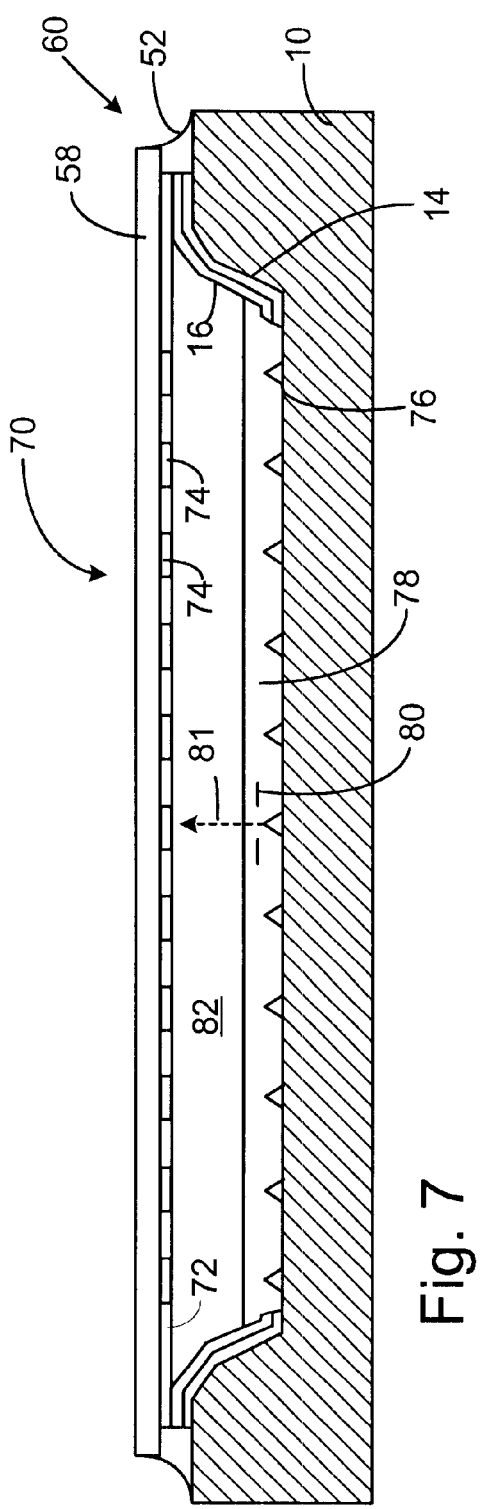
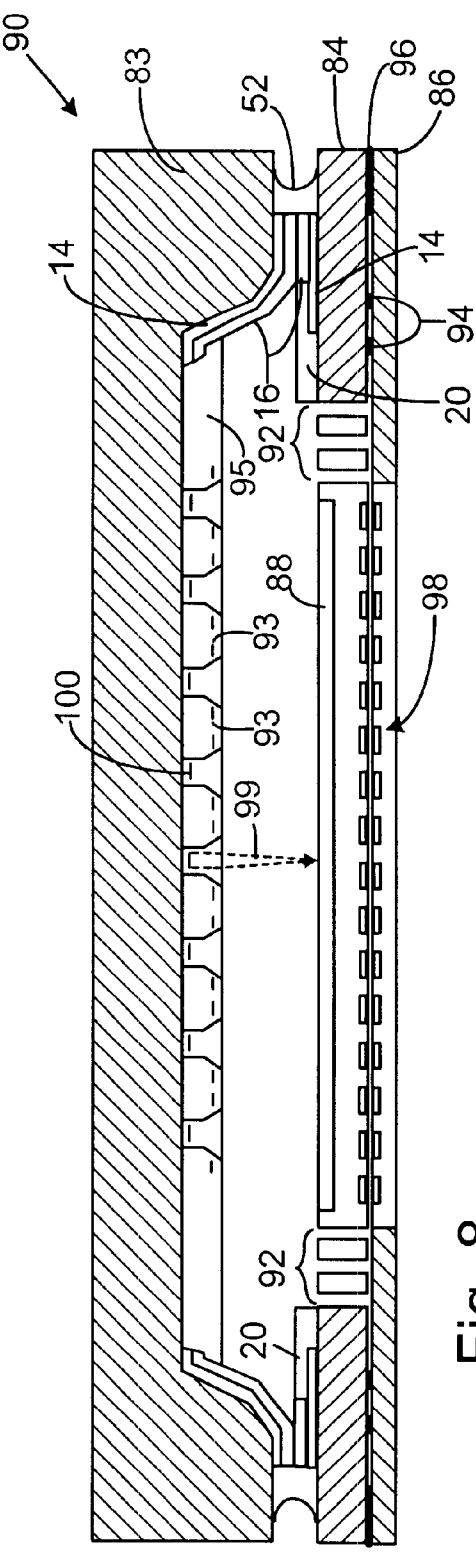
Fig. 7
Fig. 8

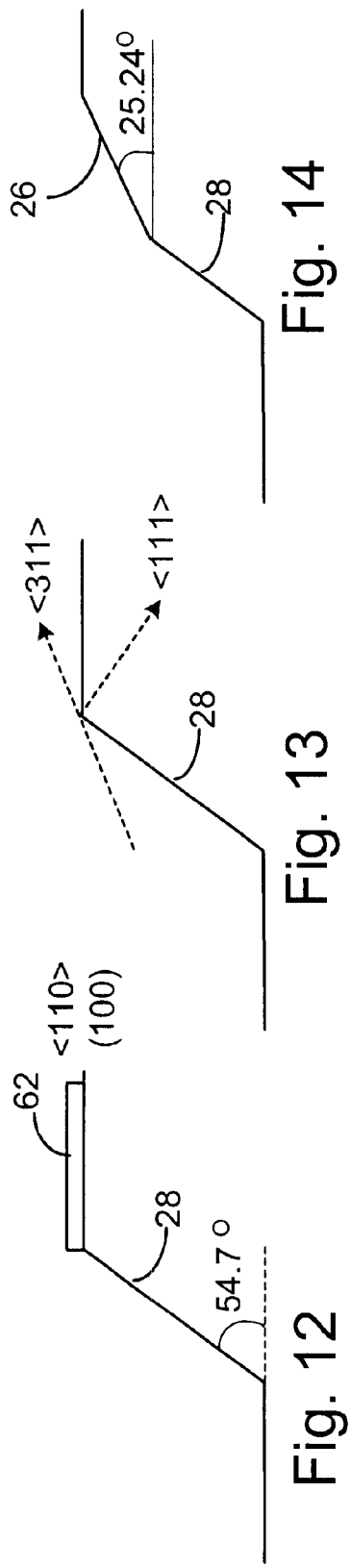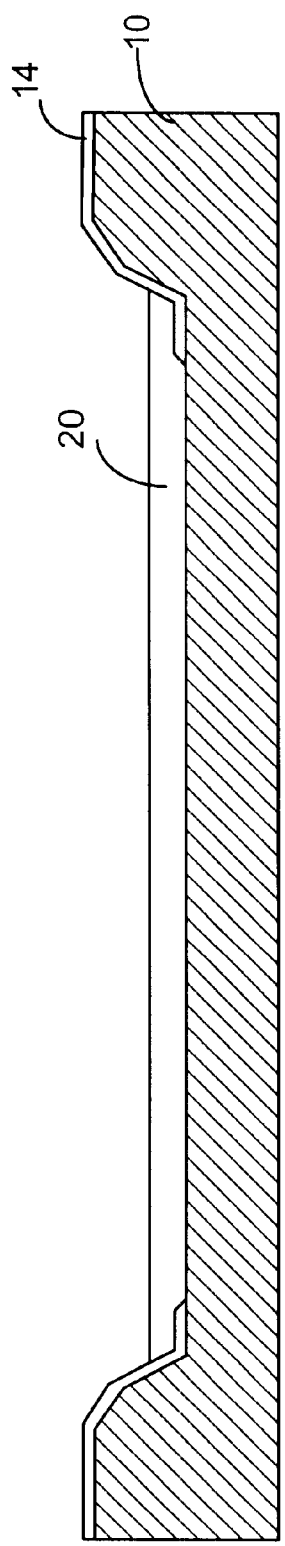

US 6,686,642 B2

MULTI-LEVEL INTEGRATED CIRCUIT FOR WIDE-GAP SUBSTRATE BONDING

FIELD OF THE INVENTION

The present invention relates to micro-fabrication of methods for bonding substrates to form wide-gap spacing between the portions of the substrate, and in particular, to systems that take advantage of the wide-gap spacing.

BACKGROUND

Many applications use bonded substrates to integrate different functions that are fabricated on separate substrates to take advantage of different technologies or to save space. Such applications include mass storage devices, display devices, and micro-mechanical systems (MEMs). Exemplary MEMs are pressure transducers and accelerometers to name a couple.

In several of the applications that use bonded substrates, a tightly controlled gap or space is required between the bonded substrates for thermal, electrical, or mechanical separation. One conventional solution sets a gap by applying a spacer material on at least one substrate to a desired thickness to provide the gap spacing. Conventional integrated circuit (IC) fabrication techniques to apply the spacer material, such as sputtering of metal films, cannot deposit large thickness required for some applications. Because thicker sputtered metal films suffer from stress and flaking, the amount of the gap spacing using conventional processes is limited to thicknesses less than a few microns.

However, some applications require large gaps between the substrates, for example, such as to provide for high voltage separation or isolation. To ensure long term reliability, preferably the space within the gap of the bonded substrates is evacuated of air and a vacuum maintained in the space over the life of a product. Any defect caused by the stress or flaking of sputtered metal films can result in a leak, thus compromising the vacuum and thereby ultimately causing the product to likely fail.

Alternatively, thick gaps can be conventionally made by electroplating at least one substrate to have a thick spacer material over the entire substrate. The spacer material then is etched to leave only the bonding spacer. However, this etching of the electroplated layer can damage other materials such as thin-film layers that have been previously applied to the substrate. Therefore, electro-plating has not been an effective option.

When bonding the separate substrates together, it is preferable to have interconnections that can carry signals and power between the bonded substrates. By adding spacer material, such as sputtered metal films or electroplated metals, the interconnections are difficult to make as the additional thickness of the spacer material must be compensated for when making the interconnections.

Accordingly, what is required is a new method of bonding various substrates from the same or different technologies that allow for wide-gap spacing and which can preferably provide an air-tight seal and preferably allow for interconnections between the bonded substrates to be easily formed.

SUMMARY

An integrated circuit includes a substrate having an etched surface and a non-etched surface. The etched surface contains circuit elements and the non-etched surface contains a bonding surface. The non-etched surface is located at a predetermined height from the etched surface. Bonding this integrated circuit with another substrate creates a wide-gap between the substrates that is preferably evacuated and hermetically sealed.

BRIEF DESCRIPTION OF THE DRAWINGS

The invention is better understood with reference to the following drawings. The elements of the drawings are not necessarily to scale relative to each other. Rather, emphasis has instead been placed upon clearly illustrating the invention. Furthermore, like reference numerals designate corresponding similar parts, though not necessarily identical, through the several views.

FIG. 1 is an exemplary embodiment of an integrated circuit that incorporates aspects of the invention.

FIG. 2 is a cross-section of the exemplary embodiment shown in FIG. 1.

FIG. 3 is a first exemplary embodiment of a micro-machined system using a multi-level integrated circuit embodied using the invention.

FIG. 4 is a second exemplary embodiment of a micro-machined system with two multi-level integrated circuits embodied using the invention.

FIG. 5 is a third exemplary embodiment of a micro-machined system with two multi-level integrated circuits embodied using the invention.

FIG. 6 is a fourth exemplary embodiment of a micro-machined system using a multi-level integrated circuit embodied by the invention to form a pressure sensor.

FIG. 7 is a fifth exemplary embodiment of a micro-machined system using a multi-level integrated circuit embodied by the invention to form a display device.

FIG. 8 is a sixth exemplary embodiment of a micro-machined system using a multi-level integrated circuit embodied by the invention to form a mass storage device.

FIGS. 9–17 are exemplary process steps used to create a multi-level integrated circuit that incorporates several aspects of the invention.

DETAILED DESCRIPTION OF THE PREFERRED AND ALTERNATIVE EMBODIMENTS

Figure 9:
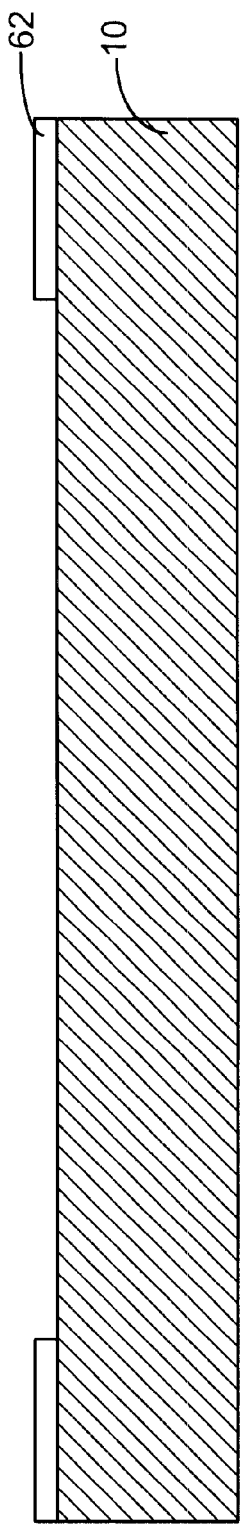

Removing substrate material from at least one of the substrates, preferably by etching, rather than by adding spacer material, solves the wide-gap substrate-bonding problem. Such a technique allows for very large gaps to be fabricated. The modified substrate embodies a multi-level topography with preferably the etched levels providing a region for circuit elements and preferably the unetched region providing an interface to the mating substrate. Further, the gap spacing is set before other processes, such as IC fabrication, are performed on the substrate. The invention allows substrates to be bonded with wide-gaps ranging between about 2 microns to about 400 microns, which is substantially beyond the abilities of conventional substrate bonding techniques. Preferably, during the removal of the substrate material, the interface between the etched level and the non-etched level is formed by a gradual incline. By providing for a gradual incline, a new method of forming interlevel connections is enabled thus allowing for easier interconnection of electrical signals and power between the bonded substrates and/or external connections. One or more etching steps, preferably utilizing the etching step used to remove substrate material to set the gap spacing can optionally create the gradual incline. Preferably, the gap setting etch removes material from the substrate everywhere except for the interconnect and bonding zones, which are preferably located near the periphery of the substrate. The etched depth (preferably determined by just measuring the etch time) and any additionally added metal thickness on the substrates required to form interconnections between the substrates determines the wide-gap spacing.

The semiconductor devices of the present invention are applicable to a broad range of semiconductor devices technologies and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also advantageously be employed in gallium arsenide, germanium, and other semiconductor materials. Accordingly, the present invention is not intended to be limited to those devices fabricated in silicon semiconductor materials, but will include those devices fabricated in one or more of the available semiconductor materials and technologies available to those skilled in the art, such as thin-film-transistor (TFT) technology using polysilicon on glass substrates.

It should be noted that the drawings are not true to scale. Further, various parts of the circuit elements have not been drawn to scale. Certain dimensions have been exaggerated in relation to other dimensions in order to provide a clearer illustration and understanding of the present invention.

In addition, although the embodiments illustrated herein are shown in two-dimensional views with various regions having depth and width, it should be clearly understood that these regions are illustrations of only a portion of a device that is actually a three-dimensional structure. Accordingly, these regions will have three dimensions, including length, width, and depth, when fabricated on an actual device.

Moreover, while the present invention is illustrated by preferred embodiments directed to circuit elements, it is not intended that these illustrations be a limitation on the scope or applicability of the present invention. It is not intended that the circuit elements of the present invention be limited to the physical structures illustrated. These structures are included to demonstrate the utility and application of the present invention to presently preferred embodiments.

The simplest embodiment of a multi-level etched substrate is an integrated circuit (IC), preferably of silicon, having the etched surface processed with semiconductor thin-films and doping materials to form circuit elements, active or passive, such as transistors, resistors, capacitors, inductors, electron emitters, photon emitters and diodes to name a few. This embodiment has the non-etched surface at a level spaced apart from the etched surface determined by the depth of material etch process. The non-etched surface is elevated (non-orientation specific) from the etched surface through preferably a gradual incline, preferably of one or more angles that are created during the etching of the material removal from the substrate. Optionally, separate etching steps can form the gradual incline after removal of the material from the substrate. Preferably, the IC has a set of continuous conductive traces extending from the etched surface to the non-etched surface used to provide electrical interconnections to either the mating bonded substrate or external connections. If interconnections between the substrates is not required, the etched surface can be separated from the non-etched surface through a steep incline, such as that which occurs using a isotropic etch process, for example a dry etch, many types of which are known to those skilled in the art.

The present invention has many features and advantages beyond that just described. The other features and advantages of the present invention will become apparent to one skilled in the art upon examination of the following description of embodiments of the invention when read in conjunction with the accompanying drawings. It is intended that all such features and advantages be included herein within the scope of the present invention as it is defined by the claims.

FIG. 1 is an exemplary embodiment of an integrated circuit (IC) 30 that incorporates several aspects of the invention. IC 30 includes a substrate 10 (preferably formed from a silicon substrate having a <100> surface) in which an etched surface includes semiconductor thin-film layers 20 that form circuit elements. The circuit elements are optionally placed into separate regions of functionality such as logic circuitry 22 and an electron emitter array 24 by way of example. Alternatively, the circuit elements can be interspersed throughout the thin-film layers. Accordingly, the thin-film layers are just shown as a representative area as the actual construction and layout of the thin film areas is not relevant to the invention other that that illustrated within the drawings to reflect the interconnections between substrates. In this embodiment, the IC 30 has a set of interlevel conductors 32 that extend from the etched surface containing the circuit elements to the non-etched surface over a gradual incline of a <111> edge 28 and a <311> edge 26. Preferably, the interlevel conductors are distributed around and near the periphery of the IC 30. Optionally, a seal 18, preferably hermetic, is disposed around the peripheral edge of the IC 30 non-etched surface that is also preferably used to form part of the bonding with a mating substrate surface.

FIG. 2 is a cross-section of the exemplary embodiment of IC 30 shown in FIG. 1. The etched surface of the substrate 10 is a predetermined depth 12 from the non-etched surface of the substrate. Anisotropic etching preferably forms the predetermined depth 12 alone, although isotropic etching followed by anisotropic etching also meets the spirit and scope of the invention. The etched surface of substrate 10 has disposed on it the fabricated thin-film layers 20 containing circuit elements preferably arraigned by function such as logic circuits 22 and emitter array 24. During fabrication of the thin-film layers, preferably a dielectric layer 14 is deposited over the etched surface, the inclined surface and the non-etched surface of substrate 10 to provide an insulating layer for interlevel conductors 16. The gradual inclined surface is illustrated as a first incline along the <111> edge 28 and a lesser incline along the <311> edge 26 before interfacing with the non-etched surface of substrate 10. Again, the optional seal 30 is shown on the peripheral edge of the non-etched surface of substrate 10. The may be made from deposition of gold-silicon eutectic to provide a low temperature hermetic seal. Other seals such as a palladium-silicide bond can be used. Preferably, the same material used for the seal is also used to create the interlevel conductors 16 to minimize processing steps, overall cost, and facilitate interconnections between the substrates.

FIG. 3 is a first exemplary embodiment 42 of a micromachined system using a multi-level integrated circuit embodied using the invention. In this embodiment, a first IC 30 has been etched to remove a portion of the substrate material and then processed with semiconductor thin-film layers 20 to create circuit elements. The circuit elements on the etched surface of IC 30 are coupled to the non-etched surface using conductive layer 16 as an interlevel conductor 32 (see FIG. 1). The conductive layer 16 is isolated from the substrate using a dielectric layer 14. The first IC 30 is shown bonded to a conventional substrate, second IC 36. The second IC 36 preferably also has been processed with semiconductor thin-film layers 20 to create circuit elements. These circuit elements are also connected with a conductive layer 16 to align with the conductive layer 16 of first IC 30. A seal 18 is shown here to provide preferably, but optionally, a hermetic seal around the peripheral edge of the first IC 30 and the second IC 36.

This configuration of substrate bonding is useful in applications such as computer systems. For example, first IC 30 can be a custom memory circuit that includes special high-speed memory. The second IC 36 is preferably a conventional microprocessor that does not use the multi-level integrated circuit of the invention. By bonding the two integrated circuit substrates together, a high-speed interface (due to short interconnections) is achieved along with electromagnetic shielding. Further, by providing for a wide-gap and the intervening space preferably evacuated of air, the circuit elements of the two integrated circuits are thermally isolated (except for radiant heat and heat transferred around the periphery). Optionally, the first IC 30 can contain input/output circuits in thin-film layers 20 that require a high-speed interface with the microprocessor on the second IC 36. Also, the processor circuit could be a custom IC processed on first IC 30 and the second IC 36 could be a standard memory IC or I/O interface IC without the multi-level IC of the invention.

FIG. 4 is a second exemplary embodiment 40 of a micro-machined system with two multi-level integrated circuits embodied using the invention. This embodiment allows for doubling of the wide-gap to further provide more thermal isolation or larger high-voltage isolation. In this embodiment, first IC 30 is bonded to a third IC 34. Both IC's are fabricated to incorporate the aspect of the invention of having multiple levels of the substrate surface. Each IC is fabricated to include thin-film layers 20 that creates circuit elements that are coupled to conductive layer 16 that is disposed on dielectric layers 14. In this embodiment, a seal 18 is disposed on each IC and is used to partially form the substrate bonding along with the interconnection of conductive layers 16 that also provide electrical connection between the two ICs. Using this embodiment, the wide-gap spacing can be doubled up to about 800 microns.

FIG. 5 is a third exemplary embodiment 44 of a micro-machined system with two multi-level integrated circuits embodied using the invention. In this embodiment, a fourth IC 38, having a surface area smaller than the surface area of first IC 30, is bonded to first IC 30 using an alternative seal 52 that is also preferably an adhesive. Optionally, the seal 18 of the earlier embodiments could be used in place of or in conjunction with alternative seal 52. The alternative seal 52 preferably provides a hermetic seal and is preferably applied after the first IC 30 and the fourth IC 38 are bonded together or optionally applied during the bonding process. In this embodiment, another feature is that conductive layer 16 on first IC 30 can extend to beyond the peripheral edge of fourth IC 38 to allow for connection to external circuits such as with wire bonding or other conventional connection techniques.

FIG. 6 is a fourth exemplary embodiment 46 of a micro-machined system using a multi-level integrated circuit embodied by the invention to form a pressure sensor. In this embodiment, the thin-film layers 20 of single etched substrate 50 contain a first pressure sensor 53, preferably a doped polysilicon layer. Also the thin-film layers 20 of non-etched substrate 54 contain a second pressure sensor 51, preferably a doped polysilicon layer. The doped polysilicon layers have a resistance that varies in proportion to the flex force applied to the layer. For the non-etched substrate a first pressure 55 is applied to the external surface of the substrate causing the substrate and accordingly the second pressure sensor 51 to flex thereby changing its resistance. The single etched substrate 50 has a second pressure 57 applied to its external surface that causes the single etched substrate and accordingly the first pressure sensor 53 to flex thereby changing its resistance. By providing a wide-gap between the two substrates, each substrate can flex without touching the other substrate. By measuring the resistance of the polysilicon layers and taking a difference or optionally a ratio of the two values, a differential pressure between the first pressure 55 and the second pressure 57 is derived. Preferably, the space between the two substrates is evacuated and sealed with a third seal 56 to prevent the pressure of compression of internal air from affecting the reading. Optionally, seal 18 of earlier embodiments can be used in conjunction with or in place of third seal 56. Other possible MEMs devices that can use this embodiment include accelerometers.

FIG. 7 is a fifth exemplary embodiment 60 of a micro-machined system using a multi-level integrated circuit embodied by the invention to form a display device 70. In this embodiment, the substrate 10 is etched to remove material and to form an etched surface that includes thin-films 78 used to create circuit elements such as spindt tip electron emitters 76 that create an electron beam 81. The electron beam 81 is focused and directed to pixels 74 using an electronic lens 80. The electron beam travels through the evacuated space 82 between the glass substrate 58 and substrate 10. Because the electron beam is negatively charged, it is directed to a high voltage anode 72. If the electron strikes a gas or other particle that is within evacuated space 82, it could become ionized and propelled towards the spindt tip with high energy. When it hits the spindt tip, the spindt tip may become damaged causing it to not operate properly. Thus, the evacuated space 82 must be held an extremely low vacuum pressure and seal 52 must provide a hermetic seal. Optionally for this embodiment, the material for conductive layer 16 can be chosen along with the material for the anode 72 to create the hermetic seal. Seal 52 can also be used as an adhesive bond.

FIG. 8 is a sixth exemplary embodiment 90 of a micro-machined system using a multi-level integrated circuit embodied by the invention to form a mass storage device using atomic resolution storage. In this embodiment, three substrates are bonded together to form the system. The emitter substrate 83 is created by removing portions of the substrate to create an etched surface that is processed with thin-films 95 to create an array of flat emitters 100 and electronic lenses 93. The flat emitters 100 create an electron beam 99 that is focused by the electronic lenses 93 to create a spot of electrons on a media 88. Media 88 is deposited onto a rotor substrate 84 that is bonded to the emitter substrate 83 using conductive layers 16 and seal 52. The media is deposited on a portion of rotor substrate 84 that is suspended and allowed to move in a first and second direction by springs 92. A stepper motor, preferably electrostatic, that is partially formed on rotor substrate 84 and a stator substrate 86, controls the first and second directions. The stator substrate 86 is bonded to rotor substrate 84 using a wafer bond 96. Electrical interconnections between the rotor substrate 84 and the stator substrate 86 are done using electrical interconnections 94. Electrical connections between the rotor substrate 84 and the emitter substrate 83 are implemented by conductive traces 16 which are disposed on dielectric layer 14, which performs isolation. The conductive traces 16 are connected to circuit elements on the emitter substrate 83.

One particular embodiment of a process to implement the invention uses the advantageous crystalline structure of a silicon substrate commonly found in conventional semiconductor wafer processing. A silicon substrate with a surface having a <100> crystalline axis (plane) is preferably masked and wet-etched with an anisotropic silicon etchant, such as tetra-methyl ammonium hydroxide (TMAH) or potassium hydroxide to name a couple, but preferably TMAH at a concentration of about 5% by weight. The etchant works upon the <100> plane of the silicon substrate surface to etch the silicon at an angle relative to the <111> plane. The etching process continues with the silicon etched away into the substrate at this angle until a desired depth is achieved, usually by monitoring the time of etching. Preferably, the desired depth is controllable to between about 2 microns and about 400 microns. Optionally, a second etching step can be performed to further graduate the incline to interface at a more gradual angle to the non-etched surface thereby allowing for better sidewall coverage during deposition of the conduction layer for interconnects. A preferable second etching step is to remove all or partially some of the mask on the substrate to expose the edges of the inclined surface to the non-etched surface. When subjecting the silicon substrate to a stronger etchant, preferably TMAH at a concentration of 25% by weight, the etchant will attack the <100> plane of the now exposed non-etched surface to the <311> plane of the silicon substrate.

Figure 10:
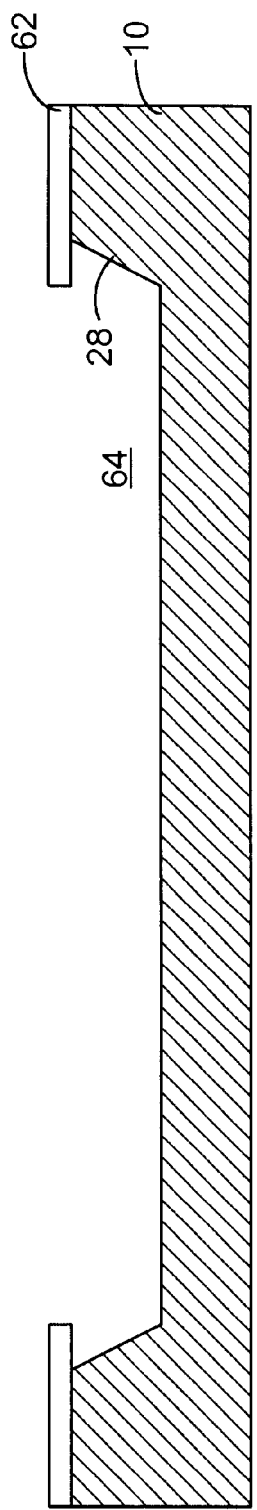

FIGS. 9–17 are exemplary process steps used to create a multi-level integrated circuit that incorporates several aspects of the invention. For example, if FIG. 9 a hard mask, preferably a dielectric layer or photoresist that is resistant to the substrate etchant is patterned on the substrate 10. Preferably the hard mask is formed using a PECVD dielectric of about 1000 Angstroms of thickness. The opening within the hard mask defines the opening where the substrate 10 will be etched. FIG. 10 is an illustration of results from an anisotropic etch, preferably TMAH at about 5% by weight concentration. An etched trench 64 forms a gradual incline from the etched surface to the non-etched surface under the hard mask 62. During etching, a portion of the substrate 10 will be generally be undercut under the hard mask 62. The gradual incline is etched along a <111> edge 28 of the crystalline structure of the silicon substrate.

Figure 11:
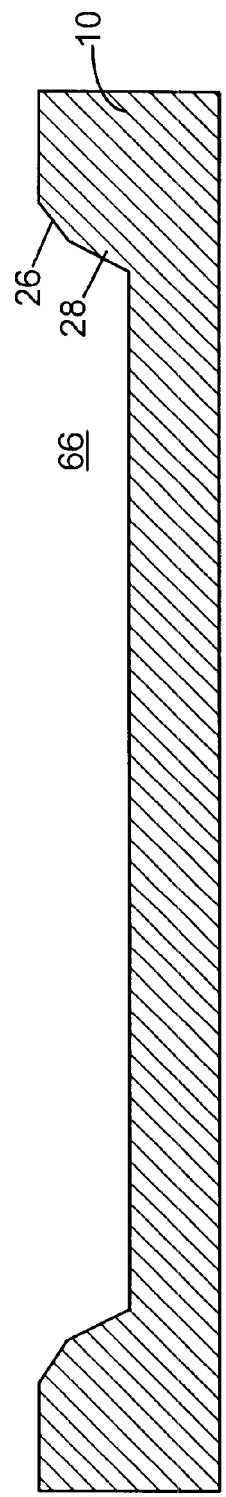

In FIG. 11, after the hard mask is partially or totally removed, a second etch of a stronger solution, preferably TMAH at about 25% by weight concentration, is performed to attach the silicon exposed by the removal of the hard mask to create a <311> edge 26 of the crystalline structure of the silicon substrate. The hard mask can be partially removed by using a dry etch process to form an isotropic edge. FIGS. 12–14 illustrate the creation of a <311> edge 26 that makes the deposition of conduction layers 16 easier. In FIG. 12 the relatively steep <111> edge 28 is shown etched at a 54.7-degree angle that correlates to the crystalline structure of the silicon substrate. The hard mask 62 is shown disposed on the <100> plane of the substrate. FIG. 13 illustrates the orientation of the <311> and the <111> crystalline structure of the substrate after the hard mask is removed from the non-etched surface. FIG. 14 shows the result of the second etch which in which the more gentle plane of the <311> edge forms a 25.24-degree incline that interfaces to the non-etched surface of the substrate. By providing for a more gradual slope than just the <111> edge 28, better coverage of the dielectric layer 14 and conductive layer 16 is possible and the possibility of thin or broken traces is essentially eliminated. By using a longer second etch, the <111> edge 28 can be optionally completely replaced by the <311> edge 26. If the <111> edge is completely replaced by the <311> edge, unwanted UV light reflections from the <111> edge to the lower etched surface can be eliminated due photomask exposure. By eliminating the unwanted UV light reflections prevents resist pattern anomalies and allows for the use of less expensive and less complicated photomask exposure machines.

Optionally, if the gradual incline is not needed or desired, <110> silicon can be used with the TMAH etch to form a sharp profile etch. This technique may be useful when working with certain MEMs devices that do not require interlevel interconnections.

Figure 16:
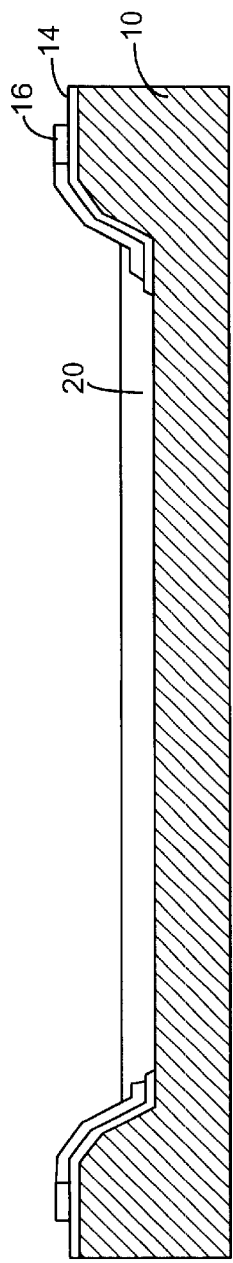
Figure 17:
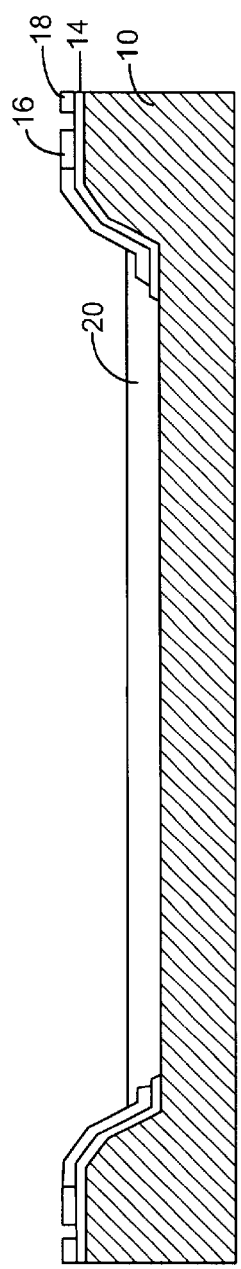

FIGS. 15–17 illustrates the result of substrate 10 after it has been processed to provide thin-film layers 20, dielectric layer 14, conductive layer 16 and seal 18, respectively. Preferably a Depth-of-Focus photolithography machine such as the DSA 1600 System manufactured by Ultra-Tek Stepper is used to allow for focusing the various thin-film processing masks over the various heights of the etched substrate. The DSA 1600 system uses a two-step stitching process to ensure proper focus over the entire wafer. The DSA 1600 system provides several hundreds of micrometers of depth resolution using the stitching capability of the machine. Thus, the thin-film layers 20, the dielectric layer 14, conductive layer 16, and seal 18 can be fabricated during one manufacturing process to reduce costs and setup and processing time.

Figure 18:
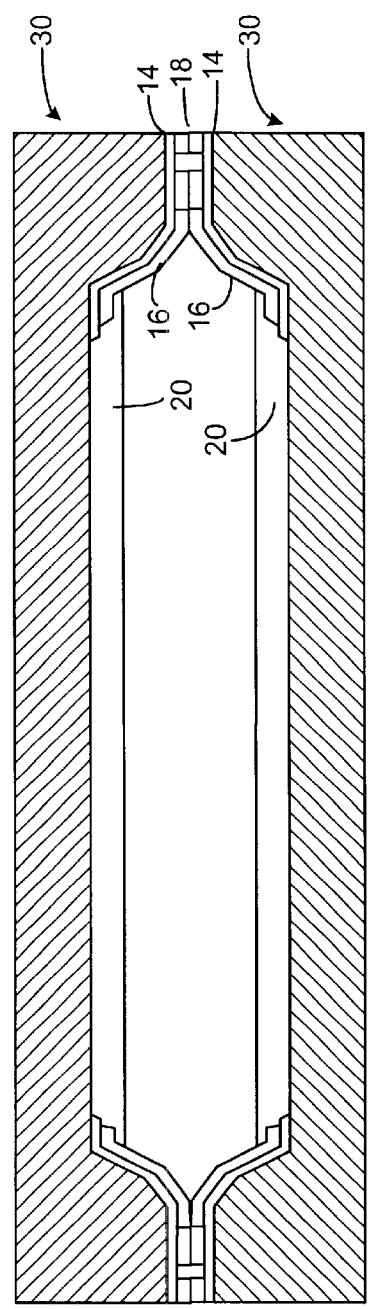
FIG. 18 is an exemplary process step of bonding multi-level integrated circuits to form a wide space gap.

FIG. 18 is an exemplary process step of bonding multi-level integrated circuits to form a wide space gap. In this process step, two substrates 30 that have been created using the process steps of FIGS. 9–17 are assembled and bonded using seal 18 on both substrates to form preferably a hermetic seal around the periphery of the outer edges of the substrates 30.

Figure 19:
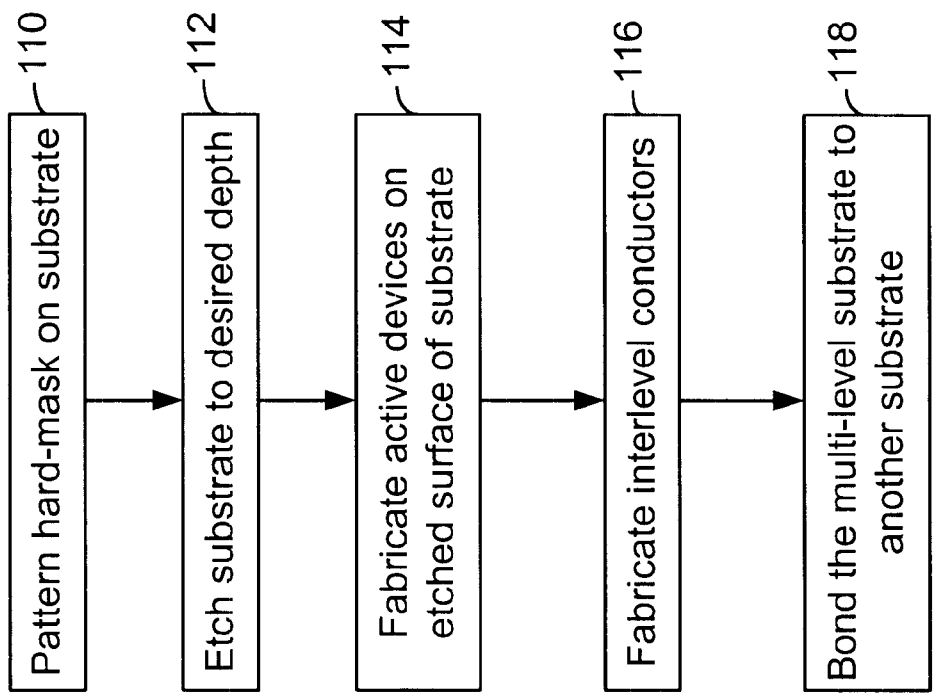
FIG. 19 is an exemplary flow chart of a process to create embodiments of the invention.

FIG. 19 is an exemplary flow chart of a general process for any substrate that can be used to create embodiments of the invention. In step 110, a hard mask is patterned on the substrate. The hard mask pattern has an opening that defines the area that will be etched from the substrate to a desired depth in step 112. The hard mask covers the non-etched level of the substrate and is preferably located on the periphery of the substrate but could also be located within the interior of the substrate. Optionally, several different etched surfaces could be formed on a single substrate to facilitate multiple fabrications of integrated circuits such as with wafer processing. Therefore, the hard mask pattern may be placed only around the periphery of each die on a substrate when fabricating several die on a wafer substrate. Also, on a single die there may be more than one etched surface and integrated circuit element processing performed on each etched surface to allow for isolation and/or electromagnetic interference separation. The desired depth in step 112 is chosen to be the wide-gap separation. The depth chosen is limited by the substrate thickness and the ability of the integrated circuit processing equipment to fabricate thin-film layers at multiple heights. Preferably, a wet etch is used so as to perform an anisotropic etch, but optionally a deep reactive ion etch (RIE) or Bosch process can also be used to create a succession of isotropic etches with polymer coated/protected sidewalls that are anisotropic on the macro scale. Preferably, the dry etch is followed by a wet etch to create a gradual incline. The gradual incline allows for excellent step coverage of inter-level connections but if these connections are not required, the single dry etch can be used to just create the wide-gap and the circuit elements fabricated on the etched surface. Connections to the circuit elements can be through the backside of the substrate using backside etching and other techniques known to those skilled in the art. Preferably, for silicon substrates having a <100> surface, a TMAH etchant is used to create the slope sidewalls that are gradually inclined. For silicon substrates having a <110> surface, the TMAH etchant will create sidewalls that have a sharp profile.

After the substrate has been etched to the desired depth, in step 114 the circuit elements are fabricated on the etched surface of the substrate. The circuit elements are preferably formed with thin-film layers and diffusions of conventional semiconductor process materials. However, some circuit elements may be made using other technology such as MEMs to create micro-machines and/or sensors.

Optionally, if interlevel connections are desired, in step 116, they are fabricated by preferably first providing an insulating layer, such as a dielectric material, for example, $SiO_2$ or SiN. By using a gradual incline with a <311> slope, the dielectric is deposited over a less acute convex corner and does not create unwanted seams that can be attacked by latter process steps such as a BOE etch. On top of the insulating layer, a conductive layer is patterned and formed to provide the electrical connection between the circuit elements and the non-etched surface. The portion of the conductive layer that is on the non-etch surface is used to make electrical connection with a mating substrate or optionally if extended past the edge of the mating substrate, to external circuits. Preferably, the interlevel connections are patterned over a gradual inclined sloped sidewall between the etched surface and the non-etched surface. Having a gradual incline allows better slope coverage when using conventional deposition equipment of both the dielectric and conductive material. Optionally, the same material used to create the conductive layer is also patterned on the periphery of the die/substrate to create a sealing surface that preferably provides a hermetic seal.

In step 119, to form a micro-machined system, the processed multi-level substrate is bonded to another substrate, optionally also multi-level. When the bonding of the substrate occurs, preferably the space created by the wide-gap is evacuated and a hermetic seal is formed to create an evacuated volume in which the circuit elements can operate without contamination from gas, air or other particles. After the substrate bonding, an additional seal can be applied around the periphery of the bonded substrate to create the hermetic seal or to provide additional adhesion between the bonded substrates.

It should be noted that it would be obvious to those skilled in the art that many variations and modifications may be made to the disclosed embodiments without substantially departing from the invention. All such variations and modifications are intended to be included herein within the scope of the present invention, as set forth in the following claims.

What is claimed is:

1. A micro-machined system, comprising:
    a first substrate having a first surface containing circuit elements of at least one of logic circuitry or electron emitter array and a second surface elevated from the first surface through a gradual incline, the substrate including a set of continuous conductive traces extending from the first surface to the second surface; and
    a second substrate having a set of conductive traces, the second substrate bonded to said first substrate such that the set of conductive traces of the first substrate contacts the set of conductive traces of the second substrate to form electrical connections.

2. The micro-machined system of claim 1 further comprising a hermetic seal enclosing the periphery of the bonded first and second substrate.

3. The micro-machined system of claim 2 wherein the hermetic seal is formed during the bonding of the first and second substrate.

4. The micro-machined system of claim 2 wherein the elevation between the first and second surfaces of the first substrate and the second substrate form an open region and wherein the open region is evacuated before the hermetic seal is formed.

5. The micro-machined system of claim 1 wherein the second substrate has a first surface containing circuit elements and a second surface elevated from the first surface.

6. The micro-machined system of claim 5 wherein the second substrate includes a set of conductive traces extending from the first surface to the second surface of the second substrate.

7. The micro-machined system of claim 1 wherein the gradual incline of the first substrate is formed at least partially along a <311> crystalline plane of the first substrate.

8. The micro-machined system of claim 1, wherein the first substrate has a first area and wherein the second substrate has a second area less than the first area.

9. The micro-machined system of claim 8 further comprising a seal disposed on the first substrate and surrounding the peripheral edge of the second substrate.

10. The micro-machined system of claim 8 wherein the set of conductive traces of the first substrate extend beyond the edges of the second substrate thereby allowing for external electrical contact to the circuit elements.

11. The micro-machined system of claim 1 further comprising means for providing a hermetic seal between the first and second substrates.

12. The micro-machined system of claim 1 wherein at least one of the first and second substrates has circuit elements that form at least a microprocessor.

13. The micro-machined system of claim 12 wherein at least one of the first and second substrates has circuit elements that form at least an array of memory circuits.

14. The micro-machined system of claim 12 wherein the at least one of the first and second substrates has circuit elements that form at least input/output circuitry for a computer system.

15. The micro-machined system of claim 1, wherein the first substrate contains electron emitters and wherein the second substrate is a glass substrate with a pattern of phosphorous material aligned with the electron emitters.

16. The micro-machined system of claim 1, further comprising:
    electron emitters formed within the circuit elements on the first substrate;
    a third substrate bonded to the second substrate and disposed between the first and second substrate, the third substrate including media that is capable of being written and read, the media fixed at a first distance from the first surface of the first substrate in a first direction; and electronic circuitry on the second substrate coupling to the media on the third substrate wherein the media is capable of being positioned in a second and third direction beneath the electron emitters.

17. The micro-machined system of claim 1 wherein the first substrate includes a first sensor for detecting pressure on the first substrate and wherein the second substrate includes a second sensor for detecting pressure on the second substrate.

* * * * *